United States Patent
Lai et al.

(10) Patent No.: US 7,539,046 B2
(45) Date of Patent: May 26, 2009

(54) INTEGRATED CIRCUIT WITH MAGNETIC MEMORY

(75) Inventors: James Chyi Lai, Saint Paul, MN (US); Tom Allen Agan, Saint Paul, MN (US)

(73) Assignee: Northern Lights Semiconductor Corp., Saint Paul, MN (US)

( * ) Notice: Subject to any disclaimer, the term of this patent is extended or adjusted under 35 U.S.C. 154(b) by 178 days.

(21) Appl. No.: 11/669,409

(22) Filed: Jan. 31, 2007

(65) Prior Publication Data

US 2008/0180993 A1 Jul. 31, 2008

(51) Int. Cl.
*G11C 11/14* (2006.01)
(52) U.S. Cl. .................. 365/158; 365/171; 365/173; 365/131; 365/66
(58) Field of Classification Search .......... 365/158, 365/131, 171, 173, 66; 257/421, E21.665; 438/3; 977/933, 934, 935
See application file for complete search history.

(56) References Cited

U.S. PATENT DOCUMENTS

| 7,269,061 B2 * | 9/2007 | Agan et al. ............... 365/158 |
| 2001/0023992 A1 | 9/2001 | Doll |
| 2004/0042291 A1 | 3/2004 | Hidaka et al. |
| 2004/0222817 A1 | 11/2004 | Madurawe |
| 2005/0009210 A1 | 1/2005 | Hosotani |
| 2005/0162903 A1 | 7/2005 | Johnson |
| 2006/0186443 A1 | 8/2006 | Hosobuchi |
| 2006/0276034 A1 | 12/2006 | Blanchard |
| 2007/0008776 A1 | 1/2007 | Scheuerlein |
| 2007/0091671 A1 * | 4/2007 | Ooishi et al. ............... 365/158 |

FOREIGN PATENT DOCUMENTS

| DE | 10261432 | 12/2003 |
| DE | 10320701 | 12/2004 |
| DE | 102004034820 | 3/2005 |
| DE | 102004022573 | 4/2005 |
| EP | 0 959 475 | 11/1999 |
| RU | 2120142 | 10/1998 |
| WO | WO 00/42613 | 7/2000 |

OTHER PUBLICATIONS

English language translation of abstract of RU 2120142.
English language translation of abstract of CN 1379473.

* cited by examiner

*Primary Examiner*—Richard Elms
*Assistant Examiner*—Harry W Byrne
(74) *Attorney, Agent, or Firm*—Thomas, Kayden, Horstemeyer & Risley

(57) ABSTRACT

An integrated circuit with magnetic memory has a silicon transistor layer, at least one magnetic memory layer, and a metal routing layer. The silicon transistor layer is arranged to generate several logic operation functions. The magnetic memory layer is arranged to store the data required by the logic operation functions. The metal routing layer has several conducting lines to transmit the data between the silicon transistor layer and the magnetic memory layer.

15 Claims, 7 Drawing Sheets

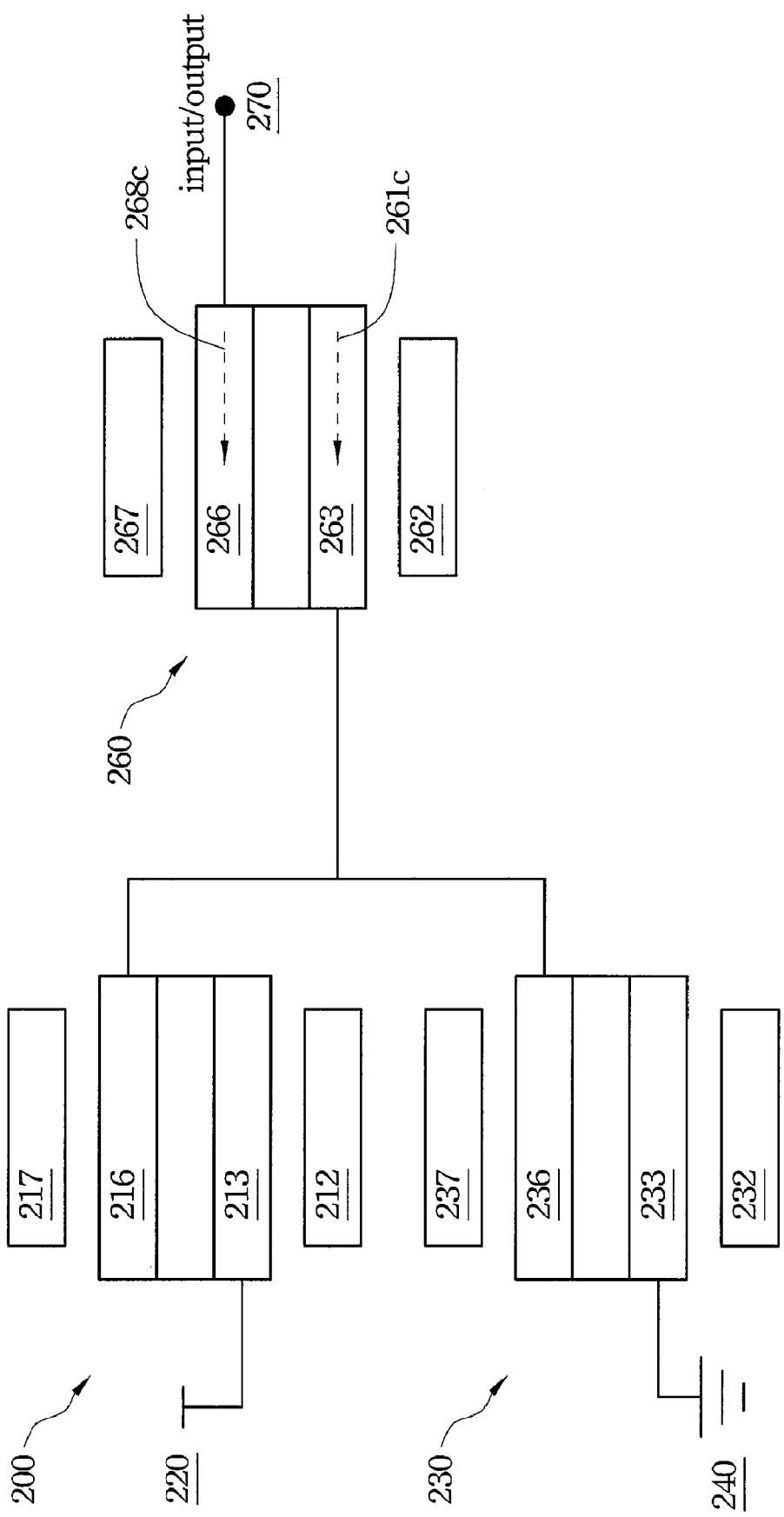

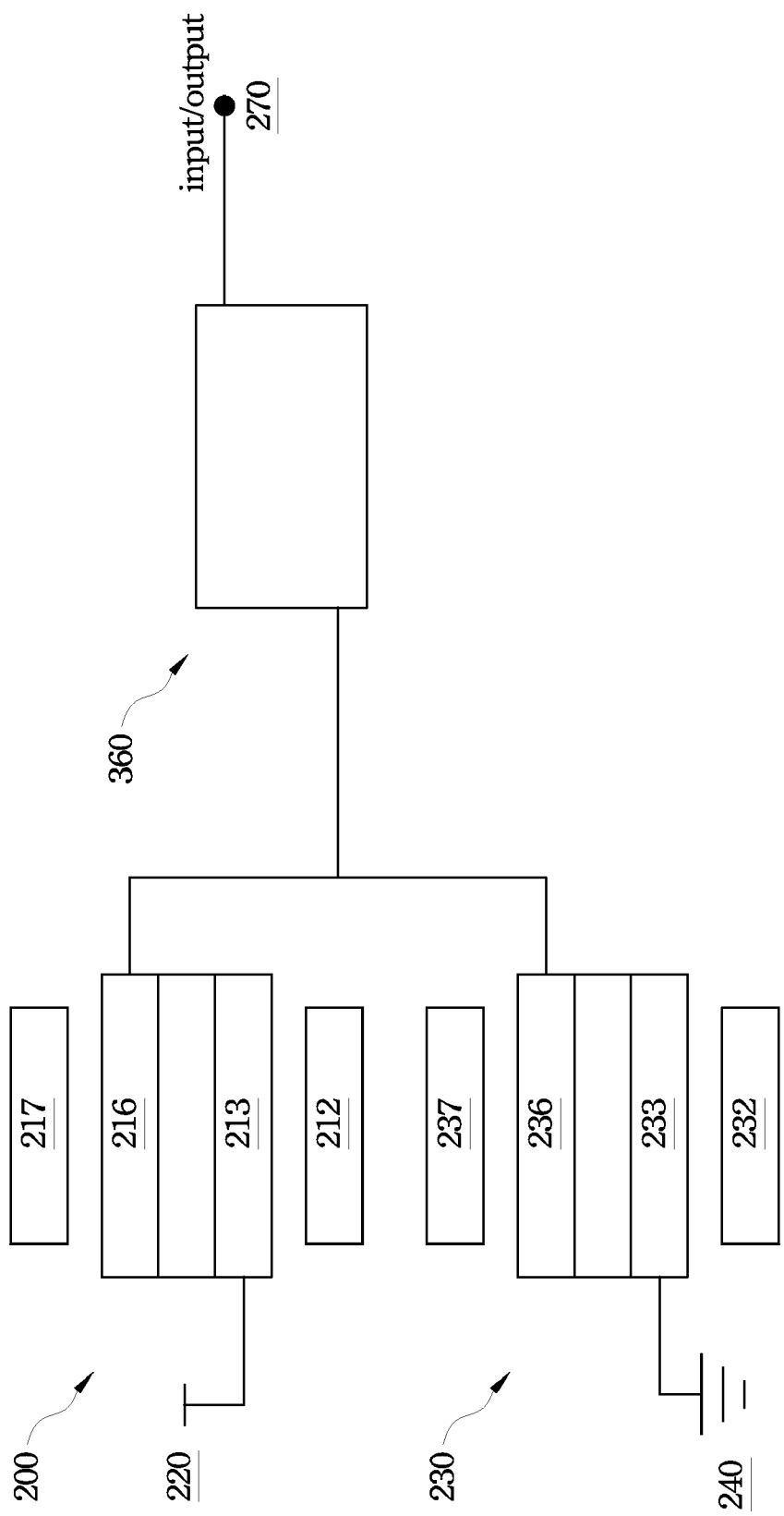

INTEGRATED CIRCUIT WITH MAGNETIC MEMORY

BACKGROUND

1. Field of Invention

The present invention relates to an integrated circuit. More particularly, the present invention relates to an integrated circuit with magnetic memory.

2. Description of Related Art

Memory devices are used abundantly in our daily lives, and therefore memory devices have become important consumer electronics components. Computers, mobile phones and MP3 players all use memory devices. Ordinary memory devices are implemented with semiconductor transistors that need expensive processing and equipment to manufacture and design.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic memory without the expensive process and equipment. The magnetic memory can be designed and manufactured with short programming time and high density.

Morever, the magnetic memory can be stacked on top of the traditionally integrated circuit to expand the storage capacity to save the area of the integrated circuit. For the foregoing reasons, there is a need to have a magnetic memory integrated by magnetic transistors.

SUMMARY

According to one embodiment of the present invention, the integrated circuit with magnetic memory has a silicon transistor layer, at least one magnetic memory layer, and a metal routing layer. The silicon transistor layer is arranged to generate several logic operation functions. The magnetic memory layer is arranged to store the data required by the logic operation functions. The metal routing layer has several conducting lines to transmit the data between the silicon transistor layer and the magnetic memory layer.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 3C is the magnetic memory cell under a read enable state according to the embodiment of this invention.

DESCRIPTION OF THE PREFERRED EMBODIMENTS

Figure 1:
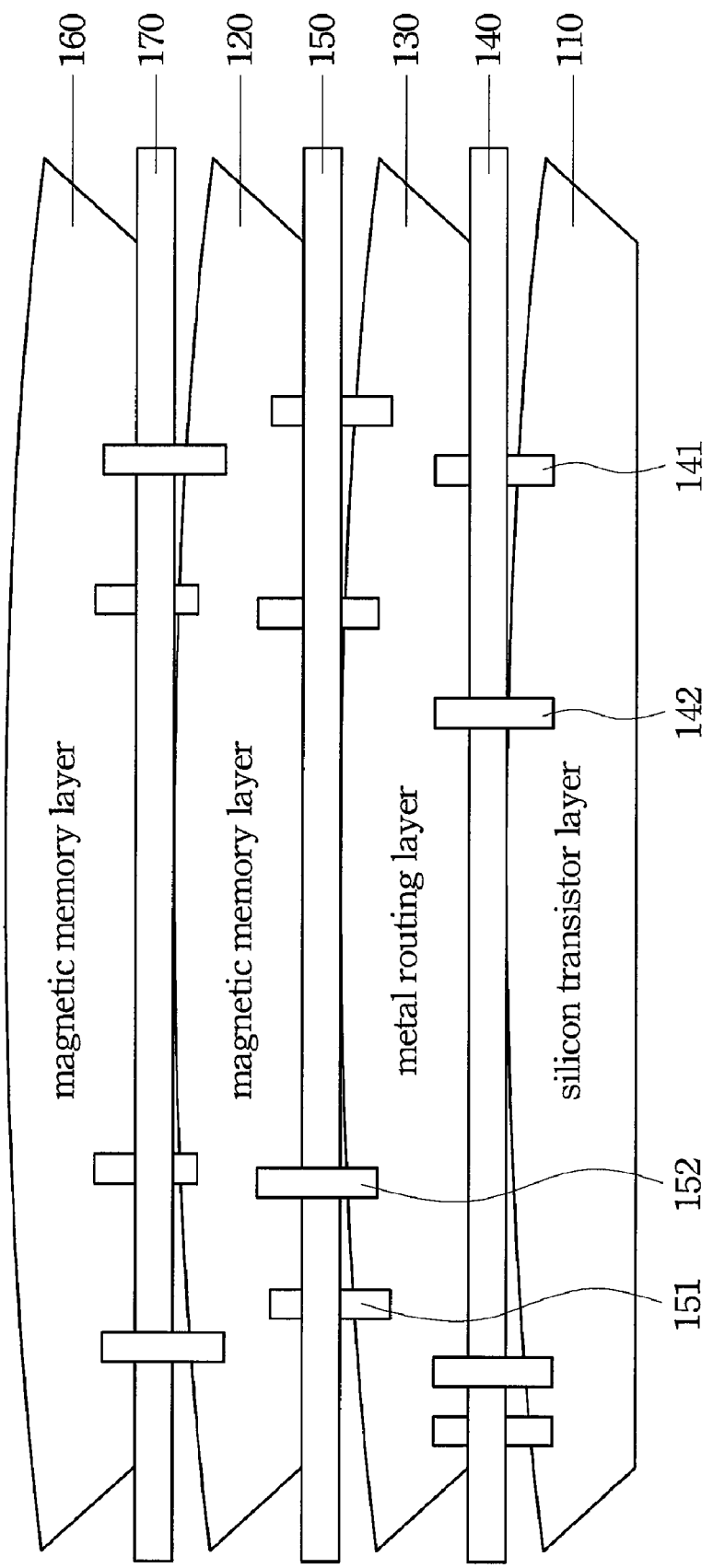
FIG. 1 is an integrated circuit with magnetic memory according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood.

FIG. 1 is an integrated circuit with magnetic memory according to an embodiment of this invention. The integrated circuit with magnetic memory has a silicon transistor layer 110, at least one magnetic memory layer 120, and a metal routing layer 130. The silicon transistor layer 110 is arranged to generate several logic operation functions. The magnetic memory layer 120 is arranged to store the data required by the logic operation functions. The metal routing layer 130 has several conducting lines (not shown) to transmit the data between the silicon transistor layer 110 and the magnetic memory layer 120.

The relative locations of the silicon transistor layer 110, the magnetic memory layer 120, and a metal routing layer 130 are arranged to easily describe the integrated circuit and are not arranged to restrict the structure of the integrated circuit. However, the metal routing layer 130 of a traditional integrated circuit is generally on the top. Therefore, in order to make the magnetic memory layer 120 conform with the current design of most integrated circuits, the metal routing layer 130 is stacked on the silicon transistor layer 110, and the magnetic memory layer 120 is stacked on the metal routing layer 130.

The integrated circuit further has a first insulator layer 140 configured between the silicon transistor layer 110 and the metal routing layer 130, and a first group of vias (such as 141 and 142) located in the first insulator layer 140 to couple the silicon transistor layer 110 to the conducting lines of the metal routing layer 130.

The integrated circuit further has a second insulator layer 150 configured between the metal routing layer 130 and the magnetic memory layer 120, and a second group of vias (such as 151 and 152) located in the second insulator layer 150 to couple the conducting lines of the metal routing layer 130 to the magnetic memory layer 120.

When the designer or user wants to expand the memory capacity, more magnetic memory layers can be added to the integrated circuit, such as the magnetic memory layer 160 stacked on the magnetic memory layer 120, and the insulator layer 170 located between the magnetic memory layers 120 and 160.

The magnetic memory layer 160 can couple to the silicon transistor layer 110 with standard routing techniques. This eliminates the need for large portions of the chip to be devoted to memory and the need to go off chip to stand alone memory chips. The signals required for the magnetic memory layer 160 are the control signals generated by the silicon transistor layer 110, such as the data to be saved and the address, along with enable, and clock if necessary.

Figure 2:
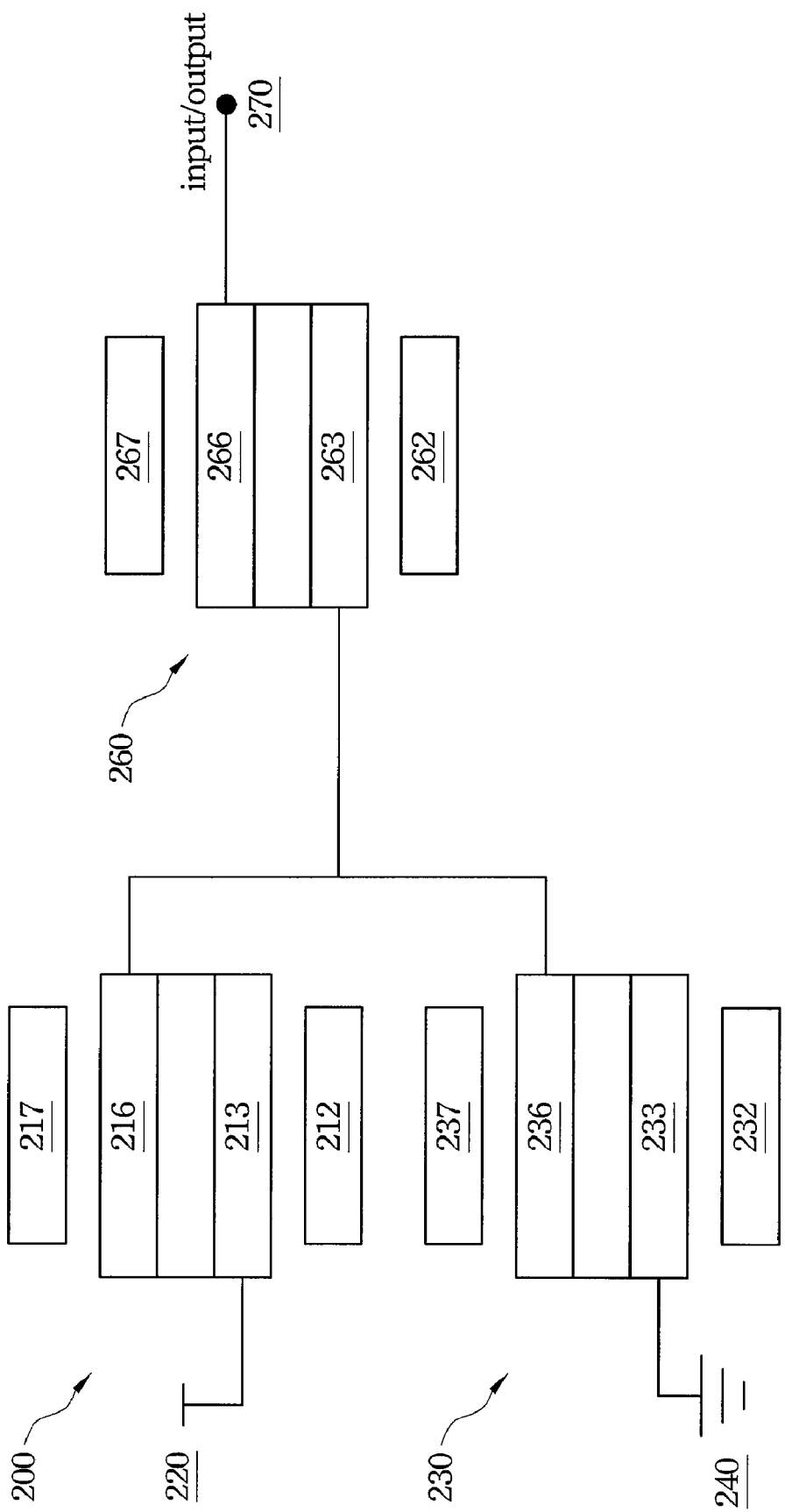
FIG. 2 is a magnetic memory cell according to an embodiment of this invention.

The magnetic memory layer 120 has several magnetic memory cells. FIG. 2 is a magnetic memory cell according to an embodiment of this invention. The magnetic memory cell has a first magnetic transistor 200, a second magnetic transistor 230, and a third magnetic transistor 260. The first magnetic transistor 200 has a first magnetic section 213 and a second magnetic section 216, wherein the first magnetic section 213 couples to a high voltage end 220. The second magnetic transistor 230 has a third magnetic section 233 and a fourth magnetic section 236, wherein the third magnetic section 233 couples to a low voltage end 240, and the fourth magnetic section 236 couples to the second magnetic section 216 of the first magnetic transistor 200. The third magnetic transistor 260 has a fifth magnetic section 263 and a sixth magnetic section 266, wherein the fifth magnetic section 263 couples with the second magnetic section 216 and the fourth magnetic section 236 together, and the sixth magnetic section 266 couples to an input/output end 270.

The magnetic memory cell further comprises a plurality of metal devices 212, 217, 232, 237, 262 and 267 respectively disposed around the magnetic sections 213, 216, 233, 236, 263 and 266, wherein the metal devices 212, 217, 232, 237, 262 and 267 are arranged to respectively control dipoles of the magnetic sections 213, 216, 233, 236, 263 and 266. For example, the first magnetic transistor 200 has metal devices 212 and 217 respectively disposed around the magnetic sections 213 and 216. The metal device 212 is arranged to control the dipole of the magnetic section 213, and the metal device 217 is arranged to control the dipole of the magnetic section 216.

From the description above, the designer can use the metal devices to control the dipoles of the magnetic sections. The designer can further use the dipoles of these two magnetic sections of one magnetic transistor to control the conductivity between their selves.

For example, when dipoles of the first magnetic section 213 and the second magnetic section 216 are the same, the first magnetic section 213 and the second magnetic section 216 are conductive, when dipoles of the first magnetic section 213 and the second magnetic section 216 are different, the first magnetic section 213 and the second magnetic section 216 are not conductive.

When dipoles of the third magnetic section 233 and the fourth magnetic section 236 are the same, the third magnetic section 233 and the fourth magnetic section 236 are conductive, when dipoles of the third magnetic section 233 and the fourth magnetic section 236 are different, the third magnetic section 233 and the fourth magnetic section 236 are not conductive.

When dipoles of the fifth magnetic section 263 and the sixth magnetic section 266 are the same, the fifth magnetic section 263 and the sixth magnetic section 266 are conductive, when dipoles of the fifth magnetic section 263 and the sixth magnetic section 266 are different, the fifth magnetic section 263 and the sixth magnetic section 266 are not conductive.

Figure 3A:
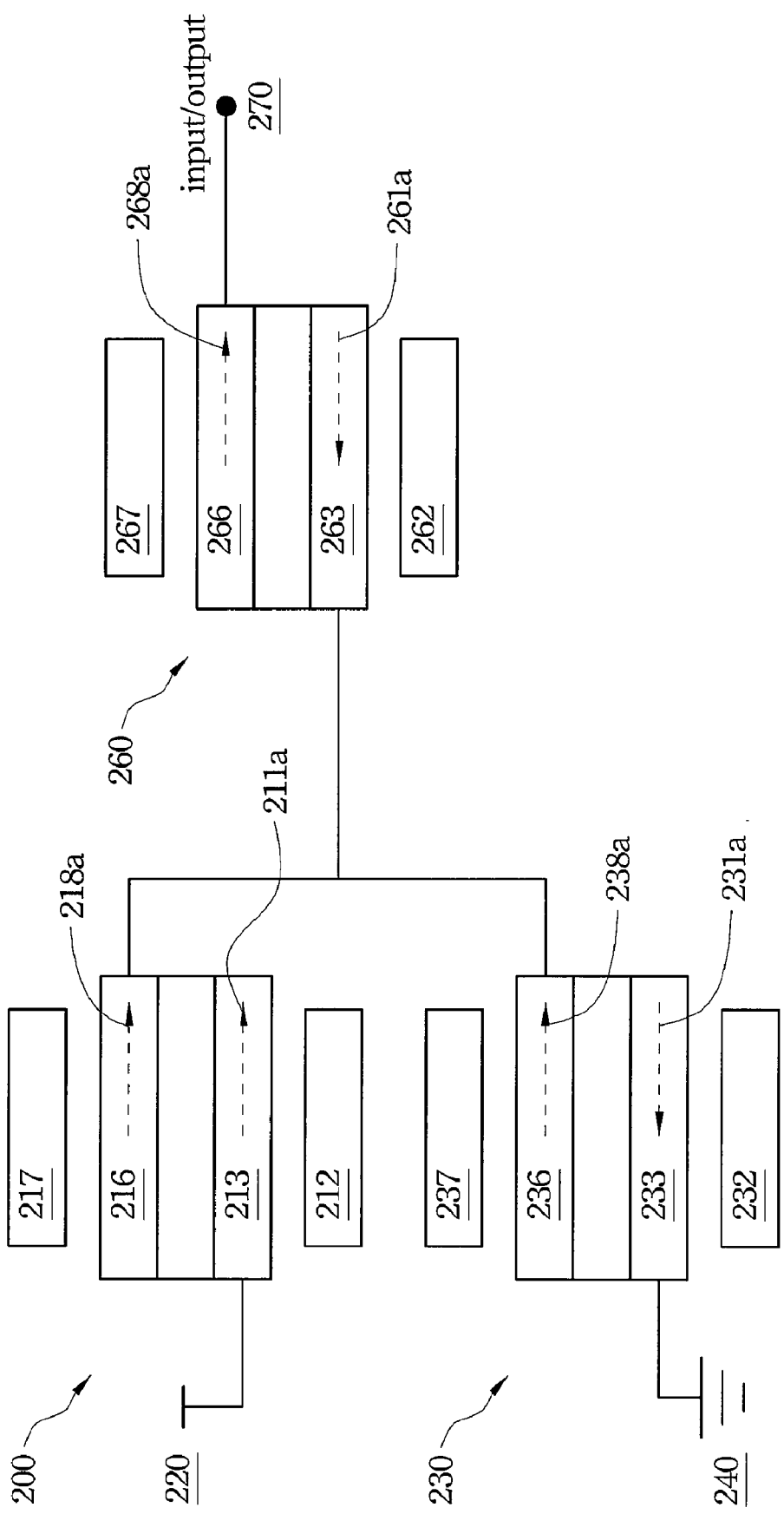
FIG. 3A is the magnetic memory cell under a storage state according to the embodiment of this invention.

FIG. 3A is the magnetic memory cell under a storage state according to the embodiment of this invention. When the magnetic memory cell is in a storage state, dipoles of the fifth magnetic section 263 and the sixth magnetic section 266 (arrows 261a and 268a) are different to make the fifth magnetic section 263 and the sixth magnetic section 266 non conductive. When the magnetic memory cell stores data '1' of the binary system, dipoles of the first magnetic section 213 and the second magnetic section 216 (arrows 211a and 218a) are the same, and dipoles of the third magnetic section 233 and the fourth magnetic section 236 (arrows 231a and 238a) are different.

The function of the first magnetic transistor 200 and the second magnetic transistor 230 can be seen as one bit of the ordinary memory cell. The third magnetic transistor 260 can be seen as a decoder or a switch of the ordinary memory cell.

Figure 3B:
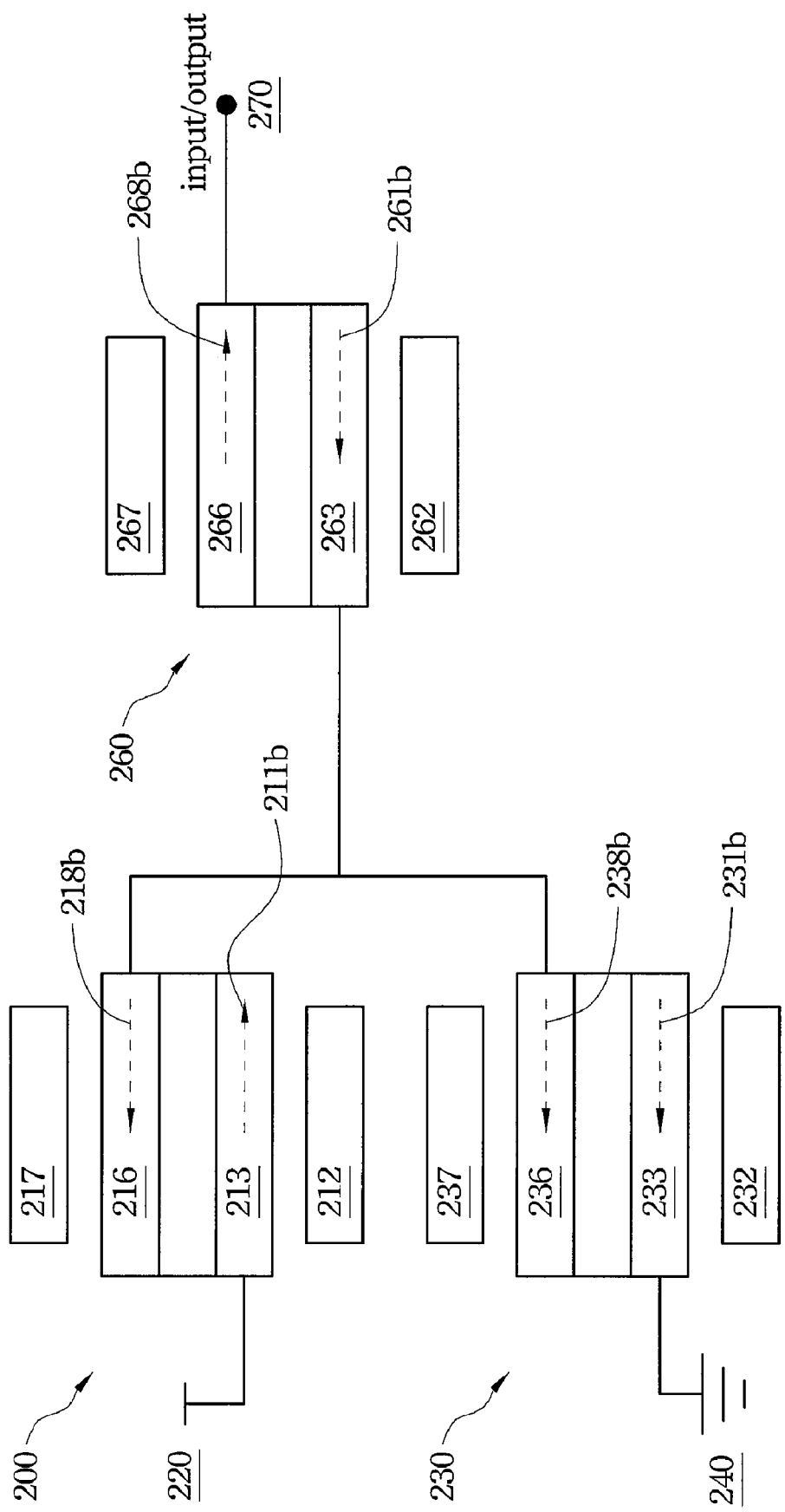
FIG. 3B is the magnetic memory cell under another storage state according to the embodiment of this invention.

FIG. 3B is the magnetic memory cell in another storage state according to the embodiment of this invention. When the magnetic memory cell stores data '0' of the binary system, dipoles of the fifth magnetic section 263 and the sixth magnetic section 266 (arrows 261b and 268b) are different, dipoles of the first magnetic section 213 and the second magnetic section 216 (arrows 211b and 218b) are different, and dipoles of the third magnetic section 233 and the fourth magnetic section 236 (arrows 231b and 238b) are the same.

FIG. 3C is the magnetic memory cell in a read enable state according to the embodiment of this invention. When the magnetic memory cell is in a reading state, dipoles (arrows 261c and 268c) of the fifth magnetic section 263 and the sixth magnetic section 266 are the same to make data outputted from the first magnetic transistor 200 or the second magnetic transistor 230 to the input/output end 270. On the other hand, when the magnetic memory cell is read disable, dipoles of the fifth magnetic section 263 and the sixth magnetic section 266 are different to prevent data from outputting to the input/output end 270.

Figure 3D:
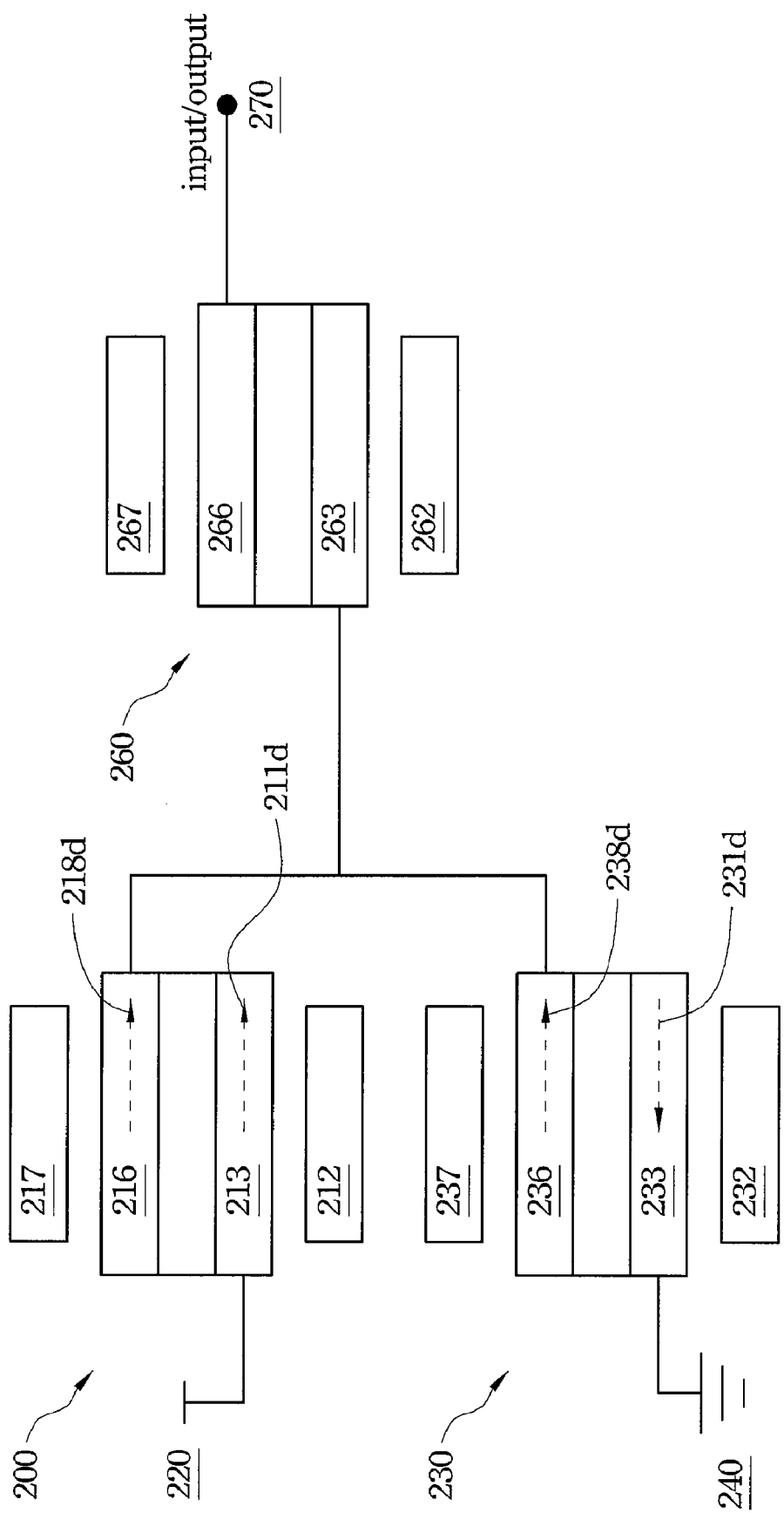
FIG. 3D is the magnetic memory cell under a writing state according to FIG. 4 is another magnetic memory cell according to another embodiment of this invention. the embodiment of this invention.

FIG. 3D is the magnetic memory cell in a writing state according to the embodiment of this invention. When the magnetic memory cell is in a writing state, dipoles of the first magnetic section 223, the second magnetic section 226, the third magnetic section 233 and the fourth magnetic section 236 are arranged to decide what data must be written in the magnetic memory cell. For example, when dipoles of the first magnetic section 223 and the second magnetic section 226 (arrows 211d and 218d) are the same, and dipoles of the third magnetic section 233 and the fourth magnetic section 236 (arrows 231d and 238d) are different, the magnetic memory cell is written as data '1'.

FIG. 4 is another magnetic memory cell according to another embodiment of this invention. The difference between FIG. 4 and FIG. 2 is that the switch 360 replaces the third magnetic transistor 260. The switch 360 has one end coupled with the second magnetic section 216 and the fourth magnetic section 236 together, and has another end coupled to the input/output end 270. The switch 360 can be implemented as a traditional transistor.

In order to make the current embodiment conform with ordinary integrated circuits of a semiconductor, a voltage of the low voltage end 240 is about 0 volts, and a voltage of the high voltage end 220 is about 2.5 volts, 3.3 volts or 5 volts.

The symbols '→' and '←' here are arranged to respectively represent the dipoles of the magnetic sections, and are not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic memory cell can be implemented by the description above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated circuit with magnetic memory, comprising:
   a silicon transistor layer arranged to generate a plurality of logic operation functions;
   a metal routing layer stacked on the silicon transistor layer and having a plurality of conducting lines; and
   a plurality of magnetic memory layers stacked on the metal routing layer, each of the magnetic memory layers comprising a plurality of magnetic memory cells and arranged to store data required by the logic operation functions and transmitted through the conducting lines of the metal routing layer to the silicon transistor layer.

2. The integrated circuit of claim 1, further comprising a first insulator layer configured between the silicon transistor layer and the metal routing layer.

3. The integrated circuit of claim 2, further comprising a first group of vias located in the first insulator layer to couple the silicon transistor layer to the conducting lines of the metal routing layer.

4. The integrated circuit of claim 1, further comprising a second insulator layer configured between the metal routing layer and the magnetic memory layer.

5. The integrated circuit of claim 4, further comprising a second group of vias located in the second insulator layer to couple the conducting lines of the metal routing layer to the first magnetic memory layer.

6. The integrated circuit of claim 1, wherein each of the magnetic memory cells comprises:
   a first magnetic transistor having a first magnetic section and a second magnetic section, wherein the first magnetic section couples to a high voltage end;
   a second magnetic transistor having a third magnetic section and a fourth magnetic section, wherein the third magnetic section couples to a low voltage end, and the fourth magnetic section couples to the second magnetic section of the first magnetic transistor; and
   a third magnetic transistor having a fifth magnetic section and a sixth magnetic section, wherein the fifth magnetic section couples with the second magnetic section and the fourth magnetic section together, and the sixth magnetic section couples to an input/output end.

7. The magnetic memory of claim 6, further comprising a plurality of metal devices respectively disposed around the magnetic sections, wherein the metal devices are arranged to respectively control dipoles of the magnetic sections.

8. The magnetic memory of claim 6, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

9. The magnetic memory of claim 6, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

10. The magnetic memory of claim 6, wherein when dipoles of the fifth magnetic section and the sixth magnetic section are the same, the fifth magnetic section and the sixth magnetic section are conductive, when dipoles of the fifth magnetic section and the sixth magnetic section are different, the fifth magnetic section and the sixth magnetic section are not conductive.

11. The magnetic memory of claim 6, wherein when the magnetic memory is under a storage state, dipoles of the fifth magnetic section and the sixth magnetic section are different.

12. The magnetic memory of claim 11, wherein when the magnetic memory stores data '1' of the binary system, dipoles of the first magnetic section and the second magnetic section are the same, and dipoles of the third magnetic section and the fourth magnetic section are different.

13. The magnetic memory of claim 11, wherein when the magnetic memory stores data '0' of the binary system, dipoles of the first magnetic section and the second magnetic section are different, and dipoles of the third magnetic section and the fourth magnetic section are the same.

14. The magnetic memory of claim 6, wherein when the magnetic memory is under a reading state, dipoles of the fifth magnetic section and the sixth magnetic section are the same to make data outputted from the first magnetic transistor or the second magnetic transistor to the input/output end.

15. The magnetic memory of claim 6, wherein when the magnetic memory is under a writing state, dipoles of the first magnetic section, the second magnetic section, the third magnetic section and the fourth magnetic section are arranged to select the data to be written to the magnetic memory.

* * * * *